Nov. 4, 1958 B. E. KEISER 2,859,419

ALL CHANNEL TELEVISION TUNER

Filed Jan. 23, 1955 4 Sheets-Sheet 1

INVENTOR
BERNHARD E. KEISER
BY Charles E. Markham
HIS AGENT

Nov. 4, 1958 B. E. KEISER 2,859,419

ALL CHANNEL TELEVISION TUNER

Filed Jan. 23, 1955 4 Sheets-Sheet 2

INVENTOR
BERNHARD E. KEISER
BY Charles E. Markham
HIS AGENT

Nov. 4, 1958 B. E. KEISER 2,859,419

ALL CHANNEL TELEVISION TUNER

Filed Jan. 23, 1955 4 Sheets-Sheet 3

INVENTOR
BERNHARD E. KEISER
BY Charles E. Markham
HIS AGENT

Nov. 4, 1958 B. E. KEISER 2,859,419

ALL CHANNEL TELEVISION TUNER

Filed Jan. 23, 1955 4 Sheets-Sheet 4

INVENTOR
BERNHARD E. KEISER
BY Charles E. Markham
HIS AGENT

United States Patent Office 2,859,419

Patented Nov. 4, 1958

2,859,419

ALL CHANNEL TELEVISION TUNER

Bernhard E. Keiser, Webster Groves, Mo., assignor, by mesne assignments, to White-Rodgers Company, a corporation of Delaware Application January 3, 1955, Serial No. 479,325

2 Claims. (Cl. 333—82)

This invention relates to radio frequency tuning devices in general and particularly to a television tuning system having a frequency range from at least 54 to 890 megacycles wherein lie the presently assigned television channels.

An object of the invention is to provide a simple and stable single conversion tuning system capable of tuning, amplifying and translating all V. H. F. and U. H. F. signals in the presently assigned eighty-two television broadcast channels, which lie in the 54 to 890 megacycle range to a relatively narrow intermediate frequency band suitable for present television receivers.

A further object is to provide a television tuning system of this frequency range which employs an inductance tuning element of novel and compact construction.

A further object is to provide an all channel television tuning system wherein all R. F. signals in the V. H. F. and U. H. F. frequency range currently assigned to television service are amplified prior to conversion to an intermediate frequency.

A further object is to provide an all channel television tuning system employing a tuning element comprising a variably shorted tuning line, which line is inductively loaded at spaced points toward the end to reduce required line length for the lower frequency portion of the range.

A further object is to provide a variably shorted line tuning element in which a portion of the line toward its outer end is sectionalized and connected by superimposed inductances to permit shortening the line length required for the lower frequency portion of the range.

A further object is to provide an all channel television tuning unit comprising several sections such as the preselector or antenna section, the R. F. amplifying section, and local ascillator section, which unit is constructed in such manner as to permit any of the sections to be conveniently detached from the unit for repairs or replacement without disturbing the circuitry or components of the remaining sections.

A further object is to provide a tuning system having a variably shorted line tuning element including a movable shorting bar, in which the shorting bar is moved along the tuning line by rotation of a tuning knob in a manner which results in approaching a linear relationship between frequency change and knob rotation through the higher portion of the frequency range.

A further object is to provide a tuning system having a variably shorted line tuning element including a movable shorting bar which is moved in such manner with respect to the tuning line that the effective length of the shorting bar is varied as it is moved along the line, thereby to achieve a more uniform movement of the shorting bar along the line for equal frequency steps.

A further object is to provide an all channel television tuning system employing printed circuits on low loss dielectric material to attain high uniformity in production and to minimize the requirement for fine auxilliary tuning.

These and other objects and advantages which become apparent when reading the following description in connection with the accompanying drawings are attained in the present invention.

Figure 1:
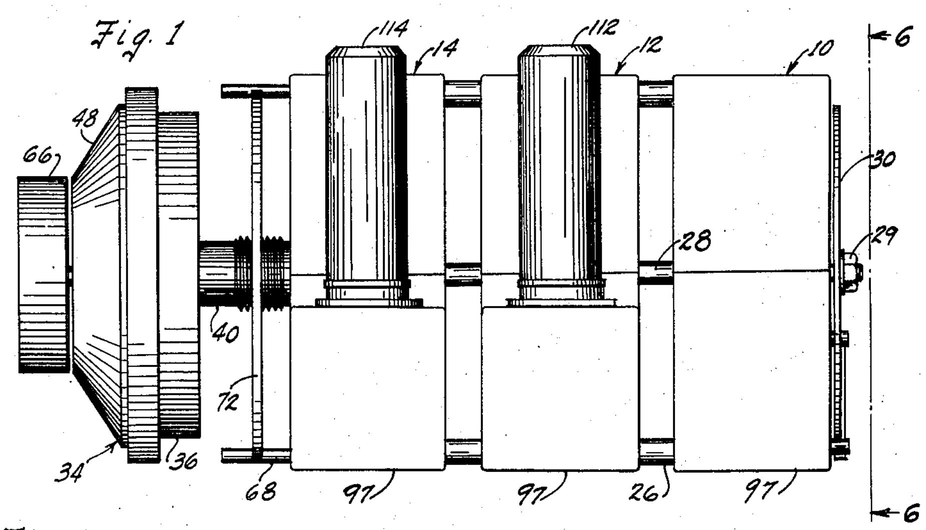
Fig. 1 is a side elevational view of an all channel television tuning unit constructed in accordance with the present invention.
Figure 2:
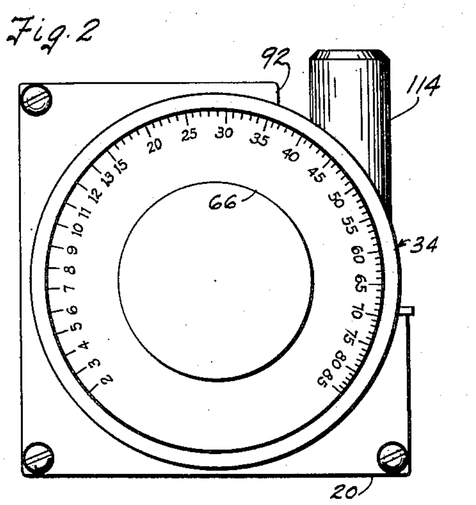
Fig. 2 is a front end elevation of the uning unit shown in Fig. 1.
Figure 8:
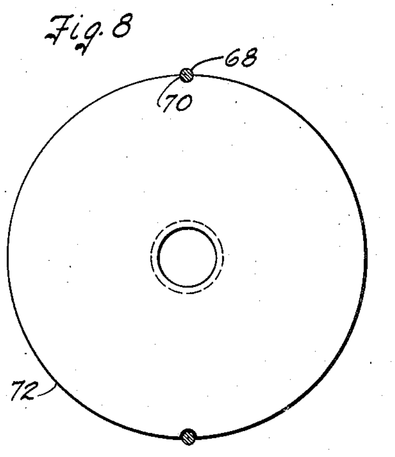
Fig. 8 is a cross-sectional view showing the fine tuning element and is taken on line 8—8 of Fig. 3.
Figure 6:
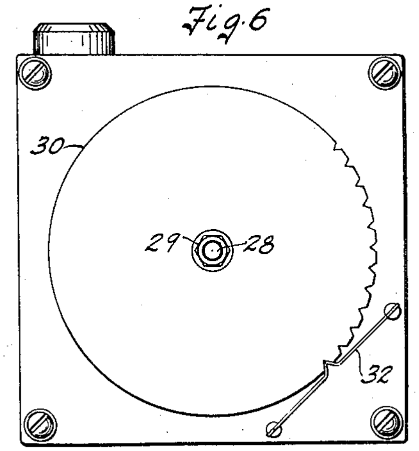
Fig. 6 is a rear end view taken on line 6—6 of Fig. 1.
Figure 3:
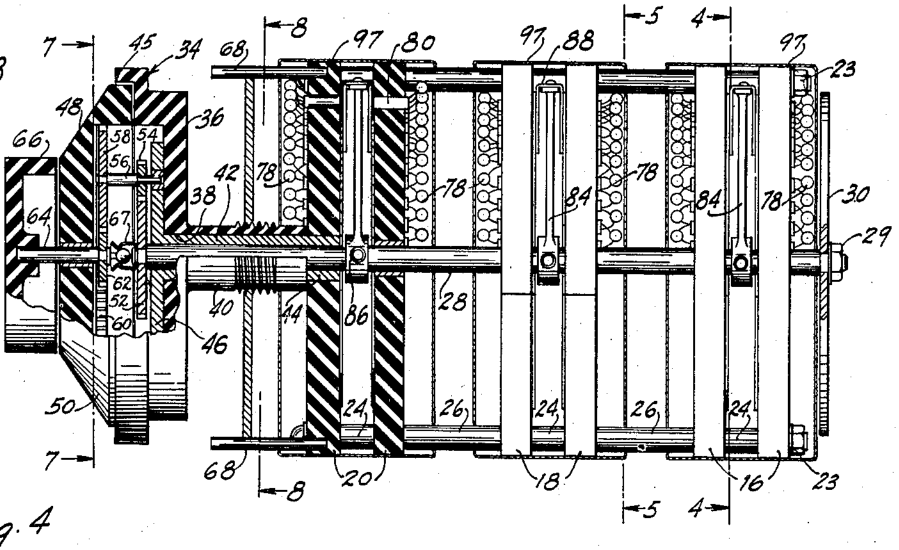
Fig. 3 is a side elevational view of the unit shown in Fig. 1 in which parts have been removed and other parts sectionalized for more comprehensive illustration.

Referring to the drawings in more detail, the tuning unit consists of three separately detachable sections which are hereinafter referred to as the antenna section generally indicated at 10, the R. F. amplifying section generally indicated at 12, and the local oscillator section generally indicated at 14.

Each of the sections comprise a pair of rectangular mounting blocks indicated at 16, 18, and 20 respectively, which are constructed of low loss dielectric material structurally suited for the purpose. These blocks are connected at their four corners by through bolts 22 and nuts 23 and are spaced in pairs by spacing tubes 24 and 26. Passing centrally through these blocks and extending therebeyond at each end is a tuning shaft 28 which is supported and journalled in a central aperture in each of the mounting blocks.

At the rear end of the unit the shaft extension carries fixed thereon by a nut 29, a circular, detachable, detent plate 30 having spaced notches along at least a portion of its periphery for cooperation with a spring detent 32 for the purpose of indexing successive increments of rotation of shaft 28.

At the front end of the unit the projecting end of shaft 28 carries a tuning knob and dial assembly generally indicated at 34. This assembly comprises a cup-shaped, fine tuning knob 36 which is provided with a central aperture 38 in the bottom thereof and a concentric, hollow, externally threaded stud portion 40 extending therefrom. The member 36 is mounted for rotation of a fixed sleeve member 42, which sleeve is press fitted at one end at 44 in a block 20 and has at its other end an extensive flange portion 46 which lies against the inner side of the bottom of cup-shaped member 36. The shaft 28 rotates within the fixed sleeve 42.

The rim of cup-shaped tuning knob 36 is provided with an annular rebate 45 which receives therein the rim of a cup-shaped dial member 48 which has a bezel face 50 on which suitable indicia is printed.

The two cup-shaped members 36 and 48 form a casing enclosing a movement reduction gear train. This gear train comprises a large gear 52 keyed to the front end of shaft 28, a smaller gear 54 in mesh with gear 52 and keyed to one end of a shaft 56, which shaft is pivoted at that end in the flange portion 46 of the sleeve member 42. The train further includes a gear 58 keyed to the other end of shaft 56 and in mesh with a large, internal, annular gear 60 which is formed as a part of or fixed to the dial member 48. The gear 58 is also in mesh with a small central driving pinion 62 which is keyed to one end of a shaft 64, and the shaft 64 is journalled in dial 48 and rigidly fixed at its other end in a main tuning knob 66.

As the main tuning knob 66 is rotated in a clockwise direction, the dial 48 is rotated in a counterclockwise direction at a considerable reduction through gears 62, 58, and 60. At the same time shaft 28 will be rotated clockwise at a considerable reduction through the double reduction of small pinion 62 to larger gear 58 and from small gear 54 (which is keyed on the same shaft with gear 58) to the larger gear 52 on shaft 28. The main tuning knob 66 and dial member 48 are held axially in position against the fine tuning knob 36 and yet are permitted to rotate by means of a spring cup element 67 which receives the ball end of shaft 64. The tuning knob 66 and dial 48 may be disassembled from the fine tuning knob by a moderate outward pull on the knob 66.

Projecting from the front block 20 is a pair of guide rods 68 which engage diametrically opposed grooves 70 in the periphery of a fine tuning disc 72. The disc 72 is provided with a central threaded hole which receives in threaded engagement the stud portion 40 of the fine tuning knob. As the fine tuning knob 36 is rotated on fixed sleeve 38, the fine tuning disc 72 is caused to slide inward and outward along the guide rods with respect to the mounting block 20.

Figure 9:
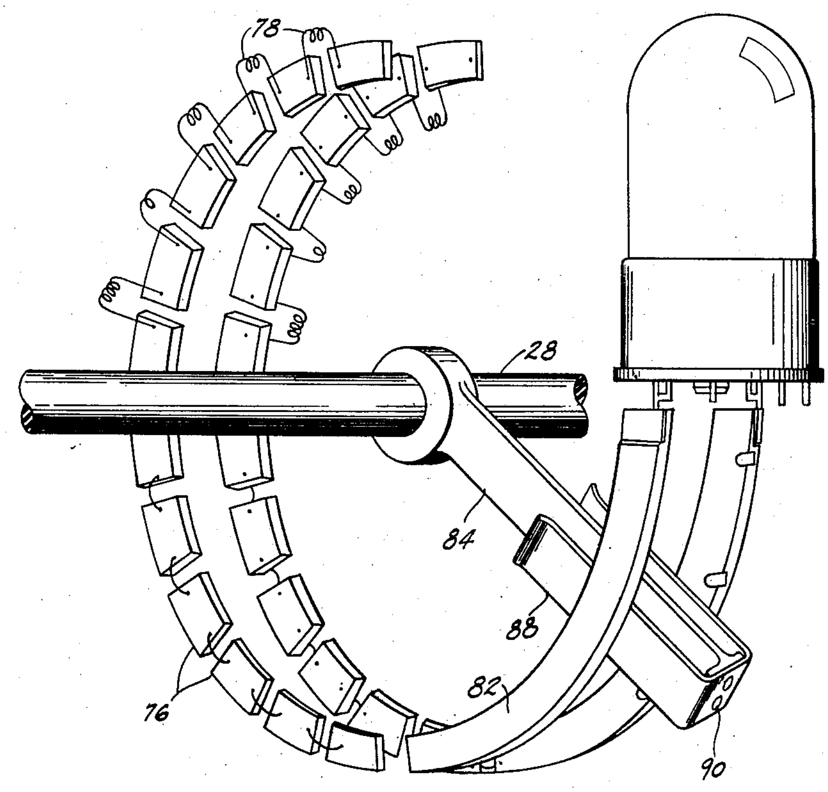
Fig. 9 is a schematic view of the variably shorted line tuning element.

The adjacent surfaces of each pair of mounting blocks 16, 18, and 20 has printed thereon, in silver, one of a pair of circular-shaped contact bars 74 which together form a tuning line. A portion of each of these contact bars, which will be referred to as the outer or V. H. F. range portion, is divided into sections 76, which sections are connected by small inductance coils 78 which decrease generally in inductance value in a counterclockwise direction with reference to Figs. 4 and 9. The inductances 78 are arranged on the opposite faces of the mounting blocks from the printed contact bars and connections are made through the mounting blocks by conducting pins 80, on one end of which the sections 76 are silver-plated and to the other ends of which the inductance coil leads are attached as by soldering. The remaining portion of each of the silver printed contact bars, which will be referred to as the inner or U. H. F. portion, is continuous as indicated at 82.

Between each pair of the mounting blocks is an arm 84 which is fixed as by set screws 86 at its inner end to shaft 28 and carried at its outer end a U-shaped shorting bar 88 having parallel legs which extend inwardly from the outer end of arm 84 and engage the adjacent parallel contact bars so as to vary the length of the tuning line with respect to the inner ends as the shaft 28 is rotated. The U-shaped shorting bar is attached at its closed end to the free end of arm 84 by pins 90.

In view of the fact that the length of an energy wave varies as the reciprocal of the frequency when the velocity is constant, the incremental movements of a shorting bar along a tuning line to tune equally spaced frequency steps become progressively shorter as the frequency increases. Therefore, for any fixed or linear relationship of motion transmission between a tuning knob and shorting bar, there results a crowding of incremental tuning knob movements and dial indicia in the higher frequency range. This renders manual selectivity extremely sensitive and difficult.

Figure 4:
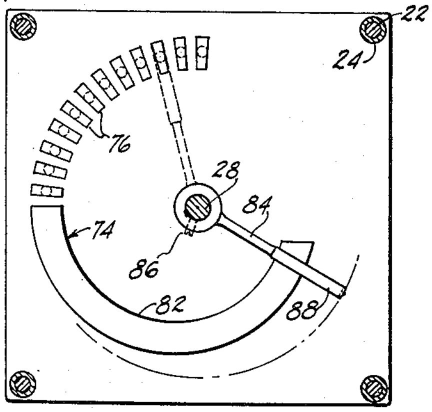
Fig. 4 is a cross-sectional view taken on line 4—4 of Fig. 3.
Figure 7:
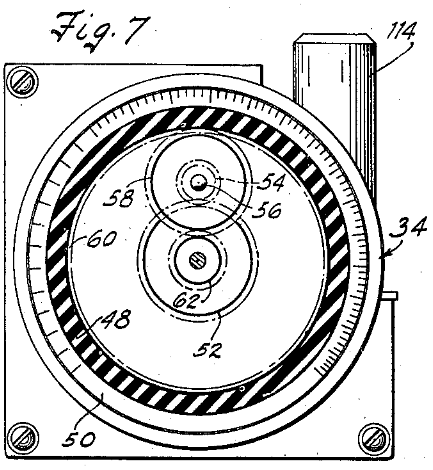
Fig. 7 is a cross-sectional view through the tuning knob assembly taken on line 7—7 of Fig. 3.
Figure 5:
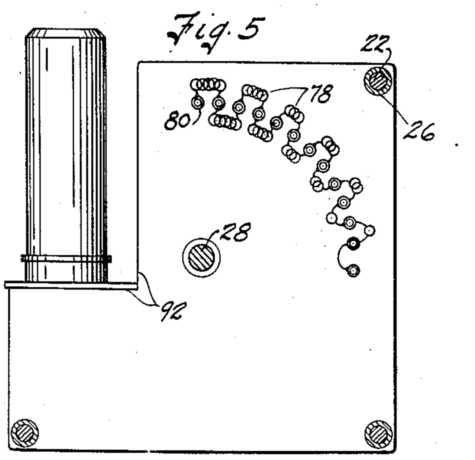
Fig. 5 is a cross-sectional view taken on line 5—5 of Fig. 3.

In order to overcome this difficulty, the continuous or higher frequency range portions 82 of the contact bars are formed so as to spiral inwardly with respect to the center of shaft 28 in a direction toward their inner ends so that, as the shaft and arm 84 are rotated counterclockwise, in Fig. 4, to shorten the tuning line, the change in length of tuning line for X any angular movement of the arm will progressively decrease. This arrangement compensates to a degree for the progressively decreasing line length change required with increasing frequency. It may be desirable, however, to further compensate for this progressively decreasing line length change in order to achieve a more nearly uniform spacing of dial marking. To accomplish this the U-shaped shorting bar described above has been provided. As the arm moves counterclockwise, in Fig. 4, it will be seen that the effective length of the shorting bar progressively increases through the U. H. F. portion of the contact bars. This increase in effective shorting bar length compensates the reduction in line length due to angular movement of the arm and requires further angular movement to effect the required net line length change.

By arranging the printed arcuate contact bars 74 to form substantially three-quarters of a circle on the mounting blocks, it is possible to cut out a portion of blocks 18 and 20 in sections 12 and 14, as indicated at 92, to permit the compact assembly in these sections of an amplifying tube and an oscillator tube respectively. This arrangement, it will be seen, also forms a convenient shelf on which to mount these tubes with their bases close to the inner, open ends of the tuning lines to which they are connected. It is to be understood that the contact bars 74 may be varied in width and thickness, particularly along the length of their U. H. F. portions, and that adjustable shunt capacitor tabs may be provided, as indicated in the circuit diagram, Fig. 10, both provisions being made to maintain tracking from channel to channel. Each of the sections 10, 12 and 14 are independently shielded by detachable shields indicated at 97.

Figure 10:
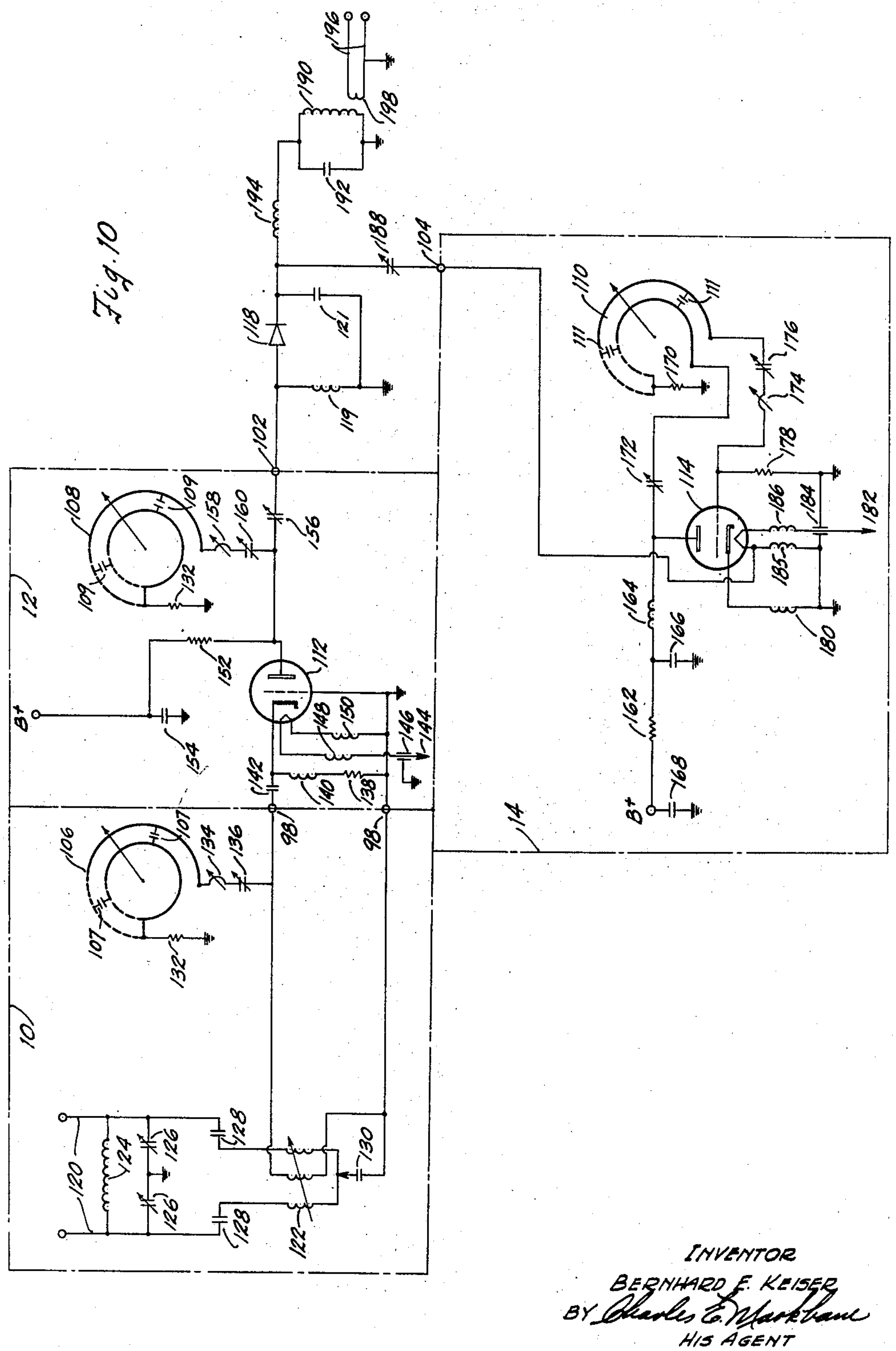
Fig. 10 is a circuit diagram of the tuning system.

Referring to the circuit diagram, Fig. 10, the antenna or preselector section, the R.-F. amplifying section and local oscillator section are framed in dot-dash lines and indicated at 10, 12, and 14 respectively. Circuit connections between sections 10 and 12 are indicated at 98 and sections 12 and 14 are connected to a crystal mixer at 102 and 104 respectively. The tuning elements for each of the sections 10, 12, and 14 are indicated at 106, 108, and 110 respectively. A vacuum tube amplifier for amplifying R.-F. signals is indicated at 112, a vacuum tube oscillator is indicated at 114, and a crystal mixer is indicated at 118.

Antenna input, indicated at 120, is transformer coupled to the input of amplifying tube 112 by the coil assembly 122. An inductance 124 connected across antenna leads 120 reduces interference of any communication signals below 30 megacycles and a pair of balance capacitors 126 maintain tuner input impedance balanced with respect to ground. Coupling capacitors 128 in lines 120 prevent any direct voltages on the antenna feed line from damaging tuner input coils 122, and a by-pass capacitor 130 is provided to help maintain the balance of input impedance of the tuner with respect to ground.

The outer ends of both contact bars and the inner end of one of the contact bars of tuning element 106 are shorted and connected to ground through a resistor 132 which is provided to reduce tuning line activity outwardly beyond the instant position of the movable shorting bar. The inner end of the other contact bar of element 106 is connected to the input to amplifier tube 112 through a series inductance 134 and a capacitor 136. These latter components are provided to maintain tracking on high and low frequency channels respectively. Adjustable shunt capacitor tabs are indicated at 107.

A cathode bias resistor 138 connected across the input to amplifier tume 112 provides a bias for the tube cathode, and an R.-F. choke 140 in series therewith provides a high R.-F. impedance between the tube cathode and ground. An input coupling capacitor 142 is also included to prevent the cathode bias of tube 112 from being shorted to ground. One side of the filament of tube 112 is connected to a source of energy supply at 144 through a by-pass capacitor 146 and an R.-F. choke 148, both of which are provided to isolate the filament supply from R.-F. voltages. The other side of the filament is connected to ground through an R.-F. choke 150 which isolates any R.-F. voltages in the filament from ground, but maintains this side of the filament at ground potential.

The plate supply of tube 112, indicated at B plus, includes a plate load resistor 152 which permits the amplified signal voltage to develop in the output circuit and isolates R.-F. plate voltage from the plate supply. A by-pass capacitor 154 in the plate supply also assists in isolating the plate supply from R.-F. voltages. The output of tube 112 is fed into the crystal mixer 118 through a coupling capacitor 156 which prevents the plate voltage of 112 from reaching the crystal mixer.

Tuning element 108 of section 12 is shorted and grounded in the same manner as tuning element 106. The open end of one of the contact bars of element 108 is connected to the output of tube 112 through a series inductance 158 and a capacitor 160 to maintain tracking through high and low frequency ranges. Adjustable shunt capacitor tabs are indicated at 109.

The vacuum tube 114 of the oscillator section 14 is connected to a plate supply, indicated at B plus, through a supply voltage resistor 162 and an R.-F. choke 164, which permits predetermination of plate voltage and prevents R.-F. plate voltages from reaching the plate supply. A pair of by-pass capacitors 166 and 168 are also provided in the plate supply to further prevent plate R.-F. voltages from reaching the plate supply.

The tuning contact bars of tuning element 110 of section 14 are shorted at their outer ends and grounded through a resistor 170 which reduces stub end activity outwardly beyond any particular position of the movable shorting bar. The open end of one of the contact bars of tuning element 110 is connected to the plate of tube 114 through a coupling capacitor 172, and the open end of the other contact bar is connected to the grid of the tube through a series of inductance 174 and a coupling capacitor 176, which latter components maintain tracking in the high and low frequency ranges. Adjustable shunt capacitor tabs are indicated at 111.

The grid of oscillator tube 114 is grounded through a grid biasing resistor 178, and its cathode is grounded through an R.-F. choke 180 which isolates R.-F. voltages from ground, but maintains cathode direct voltage at ground potential. The filament supply for tube 114 is connected at 182 to one side of the filament through a by-pass capacitor 184 and an R.-F. choke 186 which prevents R.-F. voltages from reaching the filament supply but permits full filament supply voltage to reach the filament. The other side of the tube filament is grounded through an R.-F. choke 185 which prevents R.-F. voltages from reaching ground.

The output signal of the oscillator is coupled to the crystal mixer 118 by a lead connected to the filament of oscillator tube 114 and a coupling capacitor 188. One side of the mixer 118 is grounded through an R.-F. choke 119 and the other side is grounded through a by-pass capacitor 121. The intermediate frequency signal from the crystal mixer is fed into an output tank circuit comprising an inductor 190 and a capacitor 192 which resonate at the I.-F. frequency and prevent signals of other frequencies from appearing at the output of the tuning system. The tank circuit is connected to the crystal mixer through a filter choke 194 which attenuates any R.-F. or local oscillator voltages appearing at the tuner output. The output leads 196 of the tuning system are transformer coupled to the tank circuit inductor 190 by an inductor 198.

The components of the output section of the tuning unit, being relatively small, are preferably included in the oscillator section 14 and mounted or printed on one of the mounting blocks 20. In this arrangement, it is merely necessary to make circuit disconnections at 98 and 102 when disassembling the unit. The unit may be disassembled section by section by removing the nut 29 and detent plate 30 from the end of shaft 28. With the shielding removed from the rear section, nuts 23 on through bolts 22 are removed and the set screws 86 are loosened. The sections may then be slid rearwardly off of the through bolts and shaft 28. The only circuit disconnections necessary are those at 98 and 102. The index point for dial graduations (not shown) may be placed on a trim ring surrounding the dial and mounted on the television receiver cabinet.

While the two contact bars 74 which form a tuning line are printed on adjacent block faces, it is also contemplated to print them one within the other on one face of a single block. In this arrangement one of the contact bars 74 would be arranged arcuately concentric in its entirety with respect to the path traveled by the shorting bar, while the inner portion of the other contact bar would spiral inwardly or outwardly with respect to the first mentioned contact bar. Thus the inner portions of the bars would diverge toward the inner end of the line, and the effective length of the shorting bar would increase as it is moved in a direction to shorten the tuning line. Numerous other modifications of the device as illustrated, including the tuning elements, circuit components and connections, may be made by those skilled in the art without departing from the spirit of the invention. The purpose of the foregoing description is intended to be illustrative and not limiting, the scope of the invention being set forth in the appended claims.

I claim:

1. An inductance tuning element for high frequency tuning including a variably shorted tuning line comprising a pair of spaced conductors and a U-shaped shorting bar between said conductors and engaging one of said conductors with each of its parallel legs, said shorting bar being mounted for rotation about a fixed center with its parallel legs arranged radially with respect thereto, and said spaced conductors being fixed and having at least coextending portions thereof which are spirally formed with respect to said center, whereby the effective length of said shorting bar is continuously varied as it is moved along said spirally formed portions of said conductors.

2. An inductance tuning element for high frequency tuning including a variably shorted tuning line comprising a pair of arcuate conductors, a shorting bar extending radially of said arcuate conductors and arranged to contact both conductors, said shorting bar being constrained to rotate about a fixed center, and one of said conductors having a portion thereof formed as a spiral with respect to said center, whereby the effective length of said shorting bar is continuously varied as it is moved along said portion of the contact bar.

References Cited in the file of this patent

UNITED STATES PATENTS

| | | |
|---|---|---|
| 2,126,541 | De Forest | Aug. 9, 1938 |
| 2,513,392 | Aust | July 4, 1950 |
| 2,551,228 | Aschenbach | May 1, 1951 |
| 2,558,454 | Nienaber et al. | June 26, 1951 |
| 2,587,419 | Washburn | Feb. 26, 1952 |
| 2,627,579 | Wasmansdorff | Feb. 3, 1953 |
| 2,693,581 | Osborn | Nov. 2, 1954 |
| 2,734,175 | Wasmansdorff | Feb. 7, 1956 |